United States Patent
Kim et al.

(10) Patent No.: US 8,941,133 B2
(45) Date of Patent: Jan. 27, 2015

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Doo-Hwan Kim, Yongin (KR); Il-Hwa Hong, Yongin (KR); Sang-Ha Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 154 days.

(21) Appl. No.: 13/767,623

(22) Filed: Feb. 14, 2013

(65) Prior Publication Data

US 2014/0084259 A1   Mar. 27, 2014

(30) Foreign Application Priority Data

Sep. 21, 2012 (KR) .................. 10-2012-0105247

(51) Int. Cl.
| | | |
|---|---|---|
| *H01L 29/20* | (2006.01) | |
| *H01L 33/00* | (2010.01) | |
| *H01L 21/00* | (2006.01) | |
| *H01L 51/52* | (2006.01) | |
| *H01L 51/56* | (2006.01) | |

(52) U.S. Cl.
CPC ............ *H01L 51/5237* (2013.01); *H01L 51/56* (2013.01); *H01L 2924/12044* (2013.01)
USPC ........... 257/89; 257/40; 257/E51.022; 438/70

(58) Field of Classification Search
CPC ................. H01L 2924/12044; H01L 51/5237
USPC .................. 257/40, 89, E51.022; 438/70
See application file for complete search history.

(56) References Cited

U.S. PATENT DOCUMENTS

| | | | | |
|---|---|---|---|---|
| 7,221,423 | B2 * | 5/2007 | Park et al. ..................... | 349/139 |
| 7,342,625 | B2 * | 3/2008 | Jeoung et al. ................. | 349/114 |
| 7,816,677 | B2 * | 10/2010 | Lee et al. ........................ | 257/40 |
| 7,825,590 | B2 * | 11/2010 | Park et al. ..................... | 313/506 |
| 7,943,443 | B2 * | 5/2011 | Yamazaki et al. ............ | 438/155 |
| 7,969,545 | B2 | 6/2011 | Lee | |
| 8,633,043 | B2 * | 1/2014 | Cho et al. ........................ | 438/30 |
| 2012/0161141 | A1 * | 6/2012 | Jeon et al. ....................... | 257/59 |
| 2014/0138630 | A1 * | 5/2014 | Lee et al. ........................ | 257/40 |

FOREIGN PATENT DOCUMENTS

| | | |
|---|---|---|
| KR | 10-2004-0072827 | 8/2004 |
| KR | 10-2005-0112974 | 12/2005 |
| KR | 10-2011-0001484 | 1/2011 |
| KR | 10-2011-0063227 | 6/2011 |

* cited by examiner

*Primary Examiner* — Nicholas Tobergte
(74) *Attorney, Agent, or Firm* — Robert E. Bushnell, Esq.

(57) ABSTRACT

An organic light-emitting display apparatus and a method of manufacturing the same. The organic light-emitting display apparatus includes a substrate; a first passivation layer formed on the substrate; at least one of color filters formed on the first passivation layer; an overcoat layer that covers the color filter; a second passivation layer that is formed on the first passivation layer and surrounds the overcoat layer; a first electrode formed on the second passivation layer; a second electrode facing the first electrode; and an organic layer disposed between the first electrode and the second electrode.

19 Claims, 6 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 21 Sep. 2012 and there duly assigned Serial No. 10-2012-0105247.

BACKGROUND OF THE INVENTION

1. Field of the Invention

An embodiment of the present invention relates to an organic light-emitting display apparatus and a method of manufacturing the same, and more particularly, to an organic light-emitting display apparatus that has a structure in which each sub-pixel is individually sealed and a method of manufacturing the same.

2. Description of the Related Art

In general, an organic light-emitting display device has a structure in which a functional thin film type organic light-emitting layer is inserted between an anode (positive) electrode and a cathode (negative) electrode, and emits light by recombining electrons injected from the cathode electrode and holes injected from the anode electrode in the organic light-emitting layer.

Organic electro-luminescent display (OLED) devices may be divided into a passive matrix (PM) type which is driven by a manual driving method and an active matrix (AM) type which is driven by an active driving method according to a driving method. In the PM type OLED, the anode and the cathode are simply arranged in columns and rows, respectively, and scanning signals are supplied to the cathode from the row driving circuit. At this time, only one row is selected among the multiple rows. Also, data signals are supplied to each pixel from the column driving circuit. On the other hand, the AM type OLED controls signals inputted to each pixel using a thin film transistor (TFT) and is widely used for implementing an animation since it is suitable for processing a large number of signals.

Currently, in order to realize an AM type OLED that has lower power consumption and higher bright room contrast ratio (CR), an RGB individual deposition method of a top emission type is widely used. In a method of manufacturing an AM type OLED by using the RGB individual deposition method, patterning should be performed for each of the color pixels by using a minute metal mask. However, because of sagging phenomenon of the metal mask that occurs due to precision of the metal mask when aligning it with a substrate and the increased size of masks, application of the metal mask to form a larger size AM type OLED is difficult.

An inkjet method is another method of forming the RGB individual organic light-emitting layer and has an advantage in that the inkjet method may be applied to large substrates. However, currently, the characteristic of a soluble material is inferior to the characteristic of a material for deposition, and thus, the characteristic of the soluble material must be ensured.

Besides above, a laser transfer (LITI) method independently transfers an organic light-emitting layer formed on a doner film by using a laser. However, an OLED device formed by the LITI method has a drawback in lifetime.

A white OLED (WOLED-CF) method that employs a color filter in the white OLED receives large attention when process ability and yield are considered. The WOLED-CF method uses a color filter for color patterning and has a structure in which an overcoat layer for planarizing the color filter is applied. However, unlike an inorganic layer, the materials of the color filter and the overcoat layer generate outgas, and thus, a pixel shrinkage phenomenon occurs due to the degradation of the organic light-emitting layer.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention provides an organic light-emitting display apparatus that increases reliability of products by effectively blocking outgas that causes a pixel shrinkage phenomenon of an organic light-emitting layer by applying a structure in which sub-pixels are individually sealed, and a method of manufacturing the organic light-emitting display apparatus.

In accordance with an aspect of the present invention, there is provided an organic light-emitting display apparatus including a substrate; a first passivation layer formed on the substrate; at least one color filter formed on the first passivation layer; an overcoat layer that covers the color filter; a second passivation layer that is formed on the first passivation layer and surrounds the overcoat layer; a first electrode formed on the second passivation layer; a second electrode facing the first electrode; and an organic layer disposed between the first electrode and the second electrode.

The color filter may be one of red, green, and blue color filters.

The organic light-emitting display apparatus may further include a polarizing film on a surface of the substrate.

The organic light-emitting display apparatus may further include a black matrix in which optical transmission regions and optical blocking regions are divided on the second passivation layer.

The organic light-emitting display apparatus may further include a black matrix in which optical transmission regions and optical blocking regions are divided between the substrate and the first passivation layer.

The organic light-emitting display apparatus may further include a pixel defining layer in which a pixel region and a non-pixel region are divided on the second passivation layer.

The color filter may have a thickness in a range from about 1 μm to about 5 μm.

The overcoat layer may have a thickness in a range from about 1 μm to about 10 μm.

The first and second passivation layers may include a SiOx group layer or a SiNx group layer.

The second passivation layer may have a thickness in a range from about 500 Å to about 10,000 Å.

In accordance with another aspect of the present invention, there is provided a method of manufacturing an organic light-emitting display apparatus, the method including steps of: providing a substrate; forming a first passivation layer on the substrate; forming at least one color filter on the first passivation layer; forming an overcoat layer that covers the color filter; forming a second passivation layer on the first passivation layer to surround the overcoat layer; forming a first electrode on the second passivation layer; forming an organic layer on the first electrode; and forming a second electrode on the organic layer.

The forming of the first passivation layer on the substrate may include forming the first passivation layer by using a $SiO_x$ group layer or a $SiN_x$ group layer, and the forming of the second passivation layer on the first passivation layer may include forming the first passivation layer by using a $SiO_x$ group layer or a $SiN_x$ group layer.

The forming of the second passivation layer may include forming the second passivation layer to have a thickness in a range from about 500 Å to about 10,000 Å.

The forming of at least one color filter on the first passivation layer may include forming the color filter to have a thickness in a range from about 1 μm to about 5 μm.

The forming of the overcoat layer may include forming the overcoat layer to have a thickness in a range from about 1 μm to about 10 μm.

The method may further include forming a pixel defining layer in which a pixel region and a non-pixel region are divided on the second passivation layer between the forming of the first electrode and the forming of the organic layer.

After the forming of the second electrode on the organic layer, the method may further include additionally forming a polarizing film on a surface of the substrate.

The method may further include forming a black matrix in which optical transmission regins and optical blocking regions are divided on the second passivation layer between the forming of the second passivation layer and the forming of the first electrode on the second passivation layer.

The method may further include forming a black matrix in which optical transmission regins and optical blocking regions are divided on the substrate between the forming of the substrate and the forming of the first passivation layer on the substrate.

In the organic light-emitting display apparatus constructed with the principle of embodiments of the present invention, the pixel shrinkage phenomenon due to the degradation of an organic light-emitting layer by outgas is prevented by individually sealing each of the pixels, thereby increasing product reliability.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 8A is a schematic cross-sectional view showing a state after supplying a substrate of an AM type organic light-emitting display apparatus that realizes the pixel circuit of FIG. 1, according to still another embodiment of the present invention;

FIG. 8B is a schematic cross-sectional view showing a first passivation layer formed on the substrate of FIG. 8A;

FIG. 8C is a schematic cross-sectional view showing at least a color filter formed on the first passivation layer of FIG. 8B;

FIG. 8D is a schematic cross-sectional view showing an overcoat layer covering the color filter of FIG. 8C;

FIG. 8E is a schematic cross-sectional view showing a second passivation layer formed on the first passivation layer to surround the overcoat layer of FIG. 8D; and FIG. 8F is a schematic cross-sectional view showing a pixel defining layer that defines a pixel region and a non-pixel region, a first electrode, an organic layer, and a second electrode on a second passivation layer.

DETAILED DESCRIPTION OF THE INVENTION

Figure 1:
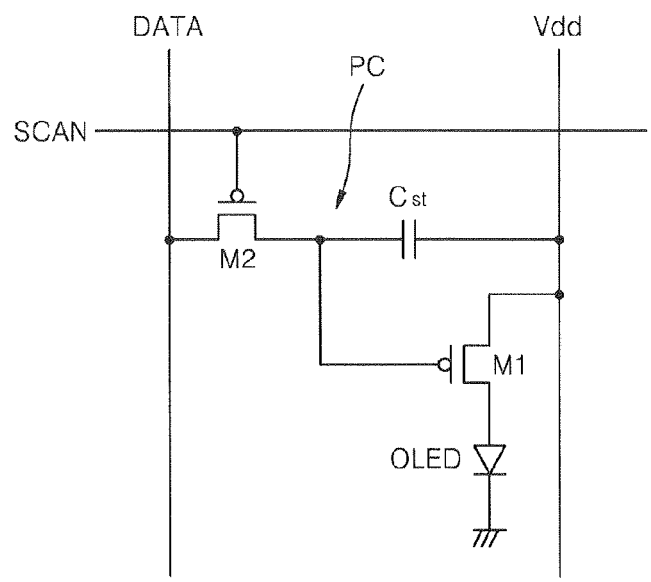
FIG. 1 is a pixel circuit diagram of a pixel of an AM type organic light-emitting display apparatus constructed with the principle of an embodiment of the present invention.

While exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. In describing the present invention, when practical descriptions with respect to related known function and configuration may unnecessarily make the scope of the present invention unclear, the descriptions thereof will be omitted.

It will be understood that, although the terms 'first', 'second', etc. may be used herein to describe various elements, these elements should not be limited by these terms. These terms are only used to distinguish one element from another.

The terminology used herein is for the purpose of describing embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereafter, the present invention will be described more fully with reference to the accompanying drawings, in which exemplary embodiments of the present invention are shown.

FIG. 1 is a pixel circuit diagram of a pixel of an AM type organic light-emitting display apparatus constructed with the principle of an embodiment of the present invention.

In reference to FIG. 1, the AM type organic light-emitting display apparatus according to an embodiment of the present invention includes a plurality of pixels (R, G, and B) that are connected to a plurality of signal lines and are arranged in approximately a matrix wherein each of the pixels has a pixel circuit PC.

Each pixel includes a data line, scan line, and a Vdd power line that is a driving power of an organic light-emitting diode (OLED). The pixel circuit PC is electrically connected to the data line, the scan line, and the Vdd line, and controls the light emission of the OLED.

Each pixel includes at least two thin film transistors (TFTs) such as a switching TFT (M2) and a driving TFT (M1), a capacitor unit Cst, and an OLED.

Figure 2:
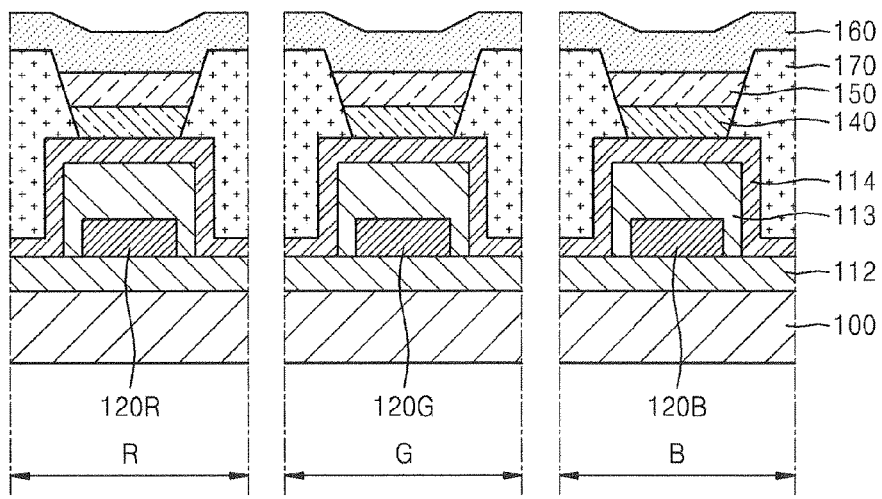
FIG. 2 is a schematic cross-sectional view of three neighboring pixels (R, G, and B) in the AM type organic light-emitting display apparatus that realizes the pixel circuit diagram of FIG. 1, according to an embodiment of the present invention.

The switching TFT (M2) is turned ON or OFF by a scan signal applied to the scan line to transmit a data signal applied to the data line to the storage capacitor unit Cst and the driving TFT (M1). The switching device is not limited to the switching TFT (M2) as depicted in FIG. 2, that is, the switching device may be a switching circuit having a plurality of TFTs and capacitors, and may further include a circuit that compensates for a Vth value of the driving TFT (M1) or a circuit that compensates for a voltage drop of the driving power Vdd.

The driving TFT (M1) determines an amount of current to be applied to the OLED in response to a data signal transmitted through the switching TFT (M2).

The capacitor unit Cst stores a data signal transmitted through the switching TFT (M2) for a period of frame.

In the circuit diagram of FIG. 1, the driving TFT (M1) and the switching TFT (M2) are PMOS TFTs. However, the present invention is not limited thereto, that is, at least one of the driving TFT (M1) and the switching TFT (M2) may be formed as an NMOS TFT. Also, the numbers of the TFTs and the capacitors are not limited thereto, that is, a greater numbers of TFTs and capacitors may be included.

Figure 3:
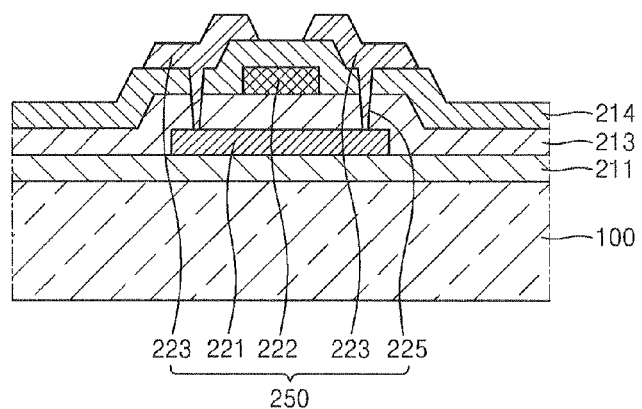
FIG. 3 is a schematic cross-sectional view of a driving thin film transistor (TFT) according to an embodiment of the present invention.

FIG. 2 is a schematic cross-sectional view of three neighboring pixels (R, G, and B) in the AM type organic light-emitting display apparatus that realizes the pixel circuit diagram of FIG. 1, according to an embodiment of the present invention. FIG. 3 is a schematic cross-sectional view of a driving TFT according to an embodiment of the present invention.

The three pixels that include a red pixel R, a green pixel G, and a blue pixel B may be repeated along a row or column, and the disposition of the pixels may be configured in various ways.

In reference to FIG. 2, the OLED display apparatus according to the current embodiment includes a red pixel R, a green pixel G, and a blue pixel B. Also, the OLED display includes red, green, and blue color filters 120R, 120G, and 120B corresponding to the red pixel R, the green pixel G, and the blue pixel B that selectively absorb white light emitted from each of the pixels.

A substrate 100 may be a transparent glass substrate formed of $SiO_2$ as the main component. However, the substrate 100 is not limited thereto, that is, the substrate 100 may be a plastic substrate or a metal substrate.

Even though not shown in FIG. 2, a driving TFT 250 as depicted in FIG. 3 may be formed on an upper surface of the substrate 100. In the current embodiment, a top gate type TFT is depicted as an example of TFT. However, unlike above, another type TFT may also be included.

Before forming the driving TFT 250 on the upper surface of the substrate 100, an insulating layer 211 such as a barrier layer and/or a buffer layer may be formed on the substrate 100 to prevent diffusion of impurity ions, to prevent penetration of moisture or external air, or to planarize the upper surface of the substrate 100. The insulating layer 211 may be formed of $SiO_2$ and/or $SiN_x$.

An active layer 221 of the driving TFT 250 may be formed on the insulating layer 211 using a semiconductor material, and a gate insulating layer 213 covering the active layer 221 is formed. The active layer 221 may be formed of an inorganic material such as amorphous silicon or polysilicon or an organic semiconductor, and includes a source region, a drain region, and a channel region between the source and drain regions.

The active layer 221 may be formed of polysilicon, and at this point, a predetermined region may be doped with a dopant. Alternatively, the active layer 221 may also be formed of amorphous silicon instead of polysilicon. Furthermore, the active layer 221 may be formed of various organic semiconductor materials such as pentacene.

The gate insulating layer 213 is formed to insulate between the active layer 221 and a gate electrode 222. The gate insulating layer 213 may be formed of an insulating material such as silicon oxide or silicon nitride, and also, may be formed of other insulating organic materials.

The gate electrode 222 is formed on the gate insulating layer 213, and an interlayer insulating layer 214 is formed to cover the gate electrode 222. Source and drain electrodes 223 formed on the interlayer insulating layer 214 are connected to the active layer 221 through contact holes 225.

The gate electrode 222 may be formed of various materials, for example, a material selected from the group consisting of Mg, Al, Ni, Cr, Mo, W, MoW, and Au. In this case, the gate electrode 222 may be configured in various various modifications, that is, the gate electrode 222 may be formed in a single layer or a composite layer.

The interlayer insulating layer 214 may be formed of an insulating material such as silicon oxide or a silicon nitride, and also, may be formed of an insulating organic material. The contact holes 225 through which source and drain regions are exposed may be formed by selectively removing the interlayer insulating layer 214 and the gate insulating layer 213. The source and drain electrode 223 may be formed in a single layer shape or a composite layer shape on the interlayer insulating layer 214 by using a material for forming the gate electrode 222 by burying the contact holes 225.

The source and drain electrode 223 of the driving TFT 250 are electrically connected to a lower electrode of the pixel.

Now turning back to FIG. 2, the TFTs formed in this way are protected by being covered by a first passivation layer 112. The first passivation layer 112 may be an inorganic insulating layer and/or an organic insulating layer. The inorganic insulating layer may be formed to include $SiO_x$, $SiN_x$, $SiO_N$, $Al_2O_3$, $TiO_2$, $Ta2O_5$, $HfO_2$, $ZrO_2$, BST, PZT, etc. The organic insulating layer may be formed to include a general polymer (poly(methylmethacrylate) (PMMA) or polystyrene (PS)), a polymer derivative having a phenol group, an acryl group polymer, an imide group polymer, an arylether group polymer, an amide group polymer, a fluorine group polymer, a p-gilyrene polymer, a vinylalcohol group polymer, and a blend of these materials. The first passivation layer 112 may be formed in a composite stack layer of an inorganic insulating material and an organic insulating material.

The red color filter 120R that corresponds to the red pixel R, the green color filter 120G that correspond to the green pixel G, and the blue color filter 120B that corresponds to the blue pixel B are formed on the first passivation layer 112. The red, green, and blue color filters 120R, 120G, and 120B may be formed by patterning a coating after coating color materials. The red, green, and blue color filters 120R, 120G, and 120B may be formed to have a thickness in a range from about 1 μm to about 5 μm to satisfy a coordination of a target color.

The red, green, and blue color filters 120R, 120G, and 120B may be arranged in a color filter on array method (COA). The red, green, and blue color filters 120R, 120G, and 120B generate different color of light by receiving white light from each of the pixels.

An overcoat layer 113 may be formed on the red, green, and blue color filters 120R, 120G, and 120B to protect the red, green, and blue color filters 120R, 120G, and 120B and to planarize a surface of the color filter layer. The overcoat layer 113 individually covers each of the red, green, and blue color filters 120R, 120G, and 120B. The overcoat layer 113 may be formed by removing a coating formed on regions except necessary regions, that is, light-emitting regions by using a photo process. The overcoat layer 113 may be formed to have a thickness in a range from about 1 μm to about 10 μm in consideration of the degree of tapering and planarizing. The overcoat layer 113 may be formed of an inorganic insulating layer and/or an organic insulating layer. The inorganic insulating layer may be formed to include $SiO_2$, $SiN_x$, SiON, $Al_2O_3$, $TiO_2$, $Ta_2O_5$, $HfO_2$, $ZrO_2$, BST, PZT, etc. The organic insulating layer may be formed to include a general polymer (poly(methylmethacrylate) (PMMA) or polystyrene (PS)), a polymer derivative having a phenol group, an acryl group polymer, an imide group polymer, an arylether group polymer, an amide group polymer, a fluorine group polymer, a p-gilyrene polymer, a vinylalcohol group polymer, and a blend of these materials. The overcoat layer 113 may be formed as a composite layer of an inorganic insulating layer and an organic insulating layer. Also, in consideration of light emission efficiency, a material having high transparency may be used.

A second passivation layer 114 may be formed on the first passivation layer 112 to surround the overcoat layer 113. The second passivation layer 114 may be formed by chemical vapour deposition, sputtering, or coating to a thickness in a range from about 500 Å to about 1000 Å. The second passivation layer 114 may be formed of the same material used to form the first passivation layer 112.

As described above, the overcoat layer 113 individually covers each of the red, green, and blue color filters 120R, 120G, and 120B and the second passivation layer 114 is formed to surround the overcoat layer 113. In one embodiment, the overcoat layer 113 individually seals each of the red, green and blue color filters 120R, 120G, and 120B, and the overcoat layer 113 covers the entirety of each color filter. Therefore, each of the red, green, and blue color filters 120R, 120G, and 120B may have an individually sealing structure. As a result, outgas may be effectively blocked, and thus, the pixel shrinkage problem due to the degradation of the organic light-light emitting layer may be prevented, thereby increasing the reliability of products.

A pixel defining layer 170 that defines a pixel region and a non-pixel region may be formed on the second passivation layer 114.

A red pixel R, a green pixel G, and a blue pixel B corresponding to the red, green, and blue color filters 120R, 120G, and 120B are formed on the second passivation layer 114.

Each of the red, green, and blue pixels R, G, and B includes a first electrode 140, an organic layer 150, and a second electrode 160.

The first electrode 140 may be formed of a conductive material, for example, ITO, IZO, ZnO, or $In_2O_3$, and may be formed to have a predetermined pattern in each of the pixels by using a photolithography method. The first electrode 140 may be electrically connected to the TFT therebelow. The first electrode 140 may act as an anode by being connected to an external electrode terminal (not shown).

The second electrode 160 is formed on the organic layer 150 corresponding to the first electrode 140. The second electrode 160 may be formed by depositing a second conductive material, for example, Li, Ca, LiF/Ca, LiF/Al, Al, Ag, Mg, Ba or a compound of these materials on the whole surface of the pixels, and thus, may be a common electrode, that is, the second electrode 160 of each of the pixels are tied in common. The second electrode 160 may act as a cathode by being connected to an external electrode terminal (not shown).

The polarities of the first electrode 140 and the second electrode 160 may be reversed.

The organic layer 150 disposed between the first electrode 140 and the second electrode 160 may be formed in a single layer or a composite layer structure by stacking an emissive layer and at least one of functional layers, such as, a hole transport layer, a hole injection layer, an electron transport layer, and an electron injection layer.

The organic layer 150 may be formed of a low molecular organic material or a polymer organic material. The low molecular organic material may be various materials, such as copper phthalocyanine (CuPc), N,N'-Di(naphthalene-1-yl)-N,N'-diphenyl-benzidine (NPB), or tris-8-hydroxyquinoline aluminum (Alq3). The polymer organic layer formed of a polymer organic material may be formed by inkjet printing or spin coating using poly-(2,4)-ethylene-dihydroxy thiophene (PEDOT) or polyaniline (PANI). The polymer organic layer may be formed of PPV, Soluble PPV's, Cyano-PPV, polyfluorene, etc.

The light-emitting layer may be a stacking type or a tandem type. The stacking type light-emitting layer may be configured of red, green, and blue sub-light-emitting layers, and the sequence of the red, green, and blue sub-light-emitting layers is not specifically limited. All of the red, green, and blue sub-light-emitting layers of the stacking type light-emitting layer may be fluorescent light-emitting layers, or alternatively, at least one of the red, green, and blue sub-light-emitting layers may be a phosphor light-emitting layer. In the tandem type light-emitting layer, all of the red, green, and blue sub-light-emitting layers may be fluorescent layer, or alternatively, at least one of the red, green, and blue sub-light-emitting layers may be a phosphor light-emitting layer. Also, in the tandem type light-emitting layer, each of the light-emitting layers may emit white light, light colors different from each other, or the same color light, and at this point, the different color and the same color light may be a mono color or a multi-color.

The sub-light-emitting layers of each pixel may have different structures. When the sub-light-emitting layers have a combination that may emit white light, the color of light that may be emitted by the sub-light-emitting layers are not limited to red, green, and blue color light, and may be combined to become various colors of light.

Figure 4:
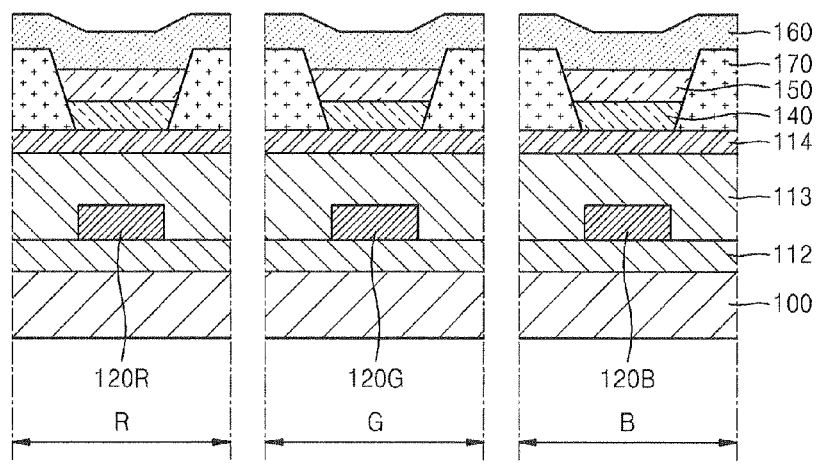
FIG. 4 is a schematic cross-sectional view of three neighboring pixels (R, G, and B) in a contemporary organic light-emitting display apparatus.

FIG. 4 is a schematic cross-sectional view of three neighboring pixels (R, G, and B) in a conventional organic light-emitting display apparatus. The descriptions of elements that are subsequently identical to the elements of the organic light-emitting display apparatus of FIG. 2 are omitted.

In reference to FIG. 4, the overcoat layer 113 is formed on an entire surface of the first passivation layer 112 and the red, green, and blue color filters 120R, 120G, and 120B. The second passivation layer 114 is formed on the overcoat layer 113. Accordingly, since each of the red, green, and blue color filters 120R, 120G, and 120B is not sealed, when a gas leak occurs in the second passivation layer 114, an outgas on the first passivation layer 112 is concentrated on the defect portion of the second passivation layer 114. Therefore, this results in damage to the red, green, and blue pixels R, G, and B, which leads to continuous pixel shrinkage.

In reference to FIG. 2, however, the overcoat layer 113 individually covers each of the red, green, and blue color filters 120R, 120G, and 120B, and the second passivation layer 114 is formed to surround the overcoat layer 113. That is, each of the red, green, and blue color filters 120R, 120G, and 120B has an individual sealing structure. Therefore, outgas may be effectively blocked and the pixel shrinkage phenomenon due to the degradation of the organic light-emitting layer may be prevented. Also, although a gas leak occurs in the second passivation layer 114, the diffusion of outgas may be minimized, and thus, failure of a product due to the pixel shrinkage phenomenon may be minimized.

Figure 5:
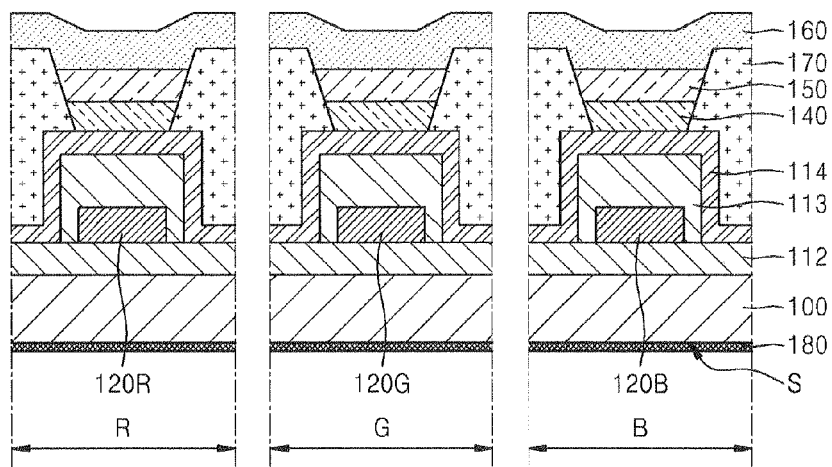
FIG. 5 is a schematic cross-sectional view of three neighboring pixels (R, G, and B) in the AM type organic light-emitting display apparatus that realizes the pixel circuit diagram of FIG. 1, according to another embodiment of the present invention.

FIG. 5 is a schematic cross-sectional view of three neighboring pixels (R, G, and B) in the AM type organic light-emitting display apparatus that realizes the pixel circuit diagram of FIG. 1, according to the principle of another embodiment of the present invention. The descriptions of configuration of elements as the same as the configuration of the AM type organic light-emitting display apparatus of FIG. 2 will be omitted.

In reference to FIG. 5, a polarizing film 180 is further disposed on a surface of the substrate 100. In particular, a flat panel display device that includes an organic light-emitting device includes the polarizing film 180 on the surface S of the substrate 100 on which an image is displayed to ease a bright contrast problem.

Figure 6:
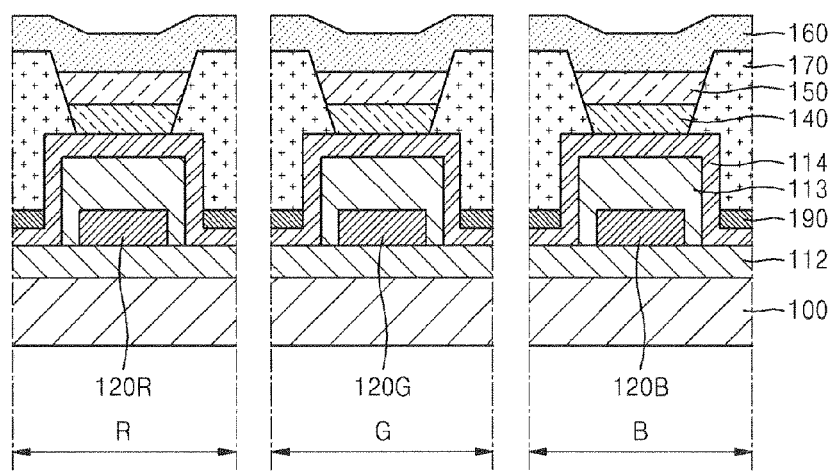
FIG. 6 is a schematic cross-sectional view of three neighboring pixels (R, G, and B) in the AM type organic light-emitting display apparatus that realizes the pixel circuit diagram of FIG. 1, according to still another embodiment of the present invention.
Figure 7:
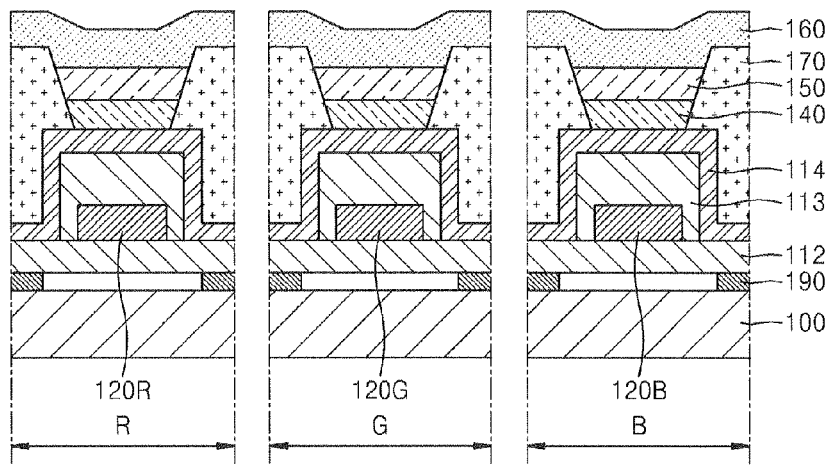
FIG. 7 is a schematic cross-sectional view of three neighboring pixels (R, G, and B) in the AM type organic light-emitting display apparatus that realizes the pixel circuit diagram of FIG. 1, according to yet another embodiment of the present invention.

FIG. 6 is a schematic cross-sectional view of three neighboring pixels (R, G, and B) in the AM type organic light-emitting display apparatus that realizes the pixel circuit diagram of FIG. 1, according to still another embodiment of the present invention. FIG. 7 is a schematic cross-sectional view of three neighboring pixels (R, G, and B) in the AM type organic light-emitting display apparatus that realizes the pixel circuit diagram of FIG. 1, according to yet another embodiment of the present invention. The descriptions of configuration of elements as the same as the configuration of the AM type organic light-emitting display apparatus of FIG. 2 will be omitted.

In reference to FIG. 6, a black matrix 190 in which optical transmission regions and optical blocking regions are formed is further disposed on the second passivation layer 114. Accordingly, light is blocked in the regions where the black matrix 190 is formed and light passes through the regions where the black matrix 190 is not formed.

In reference to FIG. 7, the black matrix 190 in which optical transmission regions and optical blocking regions are formed is further included between the first passivation layer 112 and the substrate 100. Accordingly, light is blocked in the regions where the black matrix 190 is formed and light passes through the regions where the black matrix 190 is not formed.

As described above, the AM type organic light-emitting display apparatuses of FIGS. 2, 5, 6, and 7 are bottom emission type organic light-emitting display apparatuses in which light is emitted in a direction towards the substrate 100.

However, the present invention is not limited thereto, that is, the present invention may also be applied to top emission type organic light-emitting display apparatuses. In the case of the top emission type organic light-emitting display apparatuses, the lower electrode of each pixel may be formed as a reflection electrode, and the upper electrode may be formed as a transparent electrode. The red, green, and blue color filters 120R, 120G, and 120B that correspond to each of the pixels may be formed as a stacking type on the transparent electrode or on an additional substrate.

FIGS. 8A through 8F are schematic cross-sectional views showing a method of manufacturing the AM type organic light-emitting display apparatus that realizes the pixel circuit diagram of FIG. 1, according to an embodiment of the present invention.

Figure 8A:
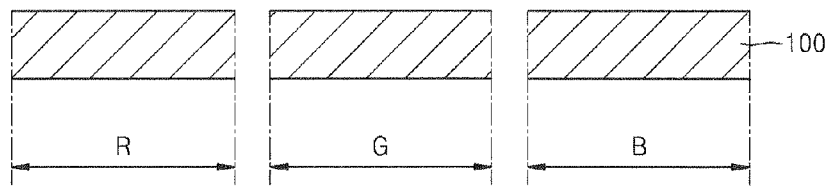
FIGS. 8A through 8F are schematic cross-sectional views showing a method of manufacturing the AM type organic light-emitting display apparatus that realizes the pixel circuit diagram of FIG. 1, according to still another embodiment of the present invention.

In reference to FIG. 8A, a substrate 100 is provided. A black matrix 190 (in reference to FIG. 7) that includes optical transmission regions and optical blocking regions may be formed on the substrate 100.

Figure 8B:
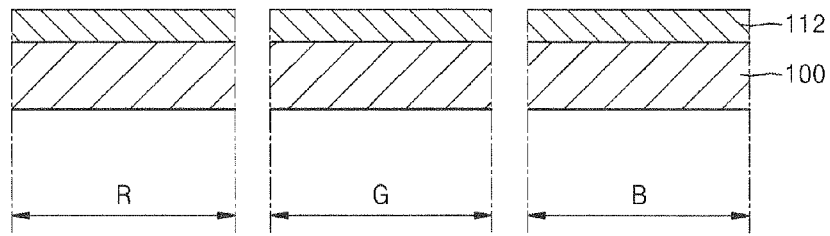

In reference to FIG. 8B, a first passivation layer 112 is formed on the substrate 100. The first passivation layer 112 may be a $SiO_x$ group layer or a $SiN_x$ group layer.

Figure 8C:
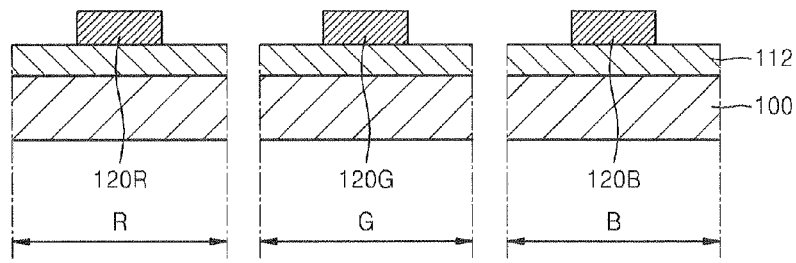

In reference to FIG. 8C, at least one of red, green, and blue color filters 120R, 120G, and 120B are formed on the first passivation layer 112. The red, green, and blue color filters 120R, 120G, and 120B may have a thickness in a range from about 1 μm to about 5 μm.

Figure 8D:
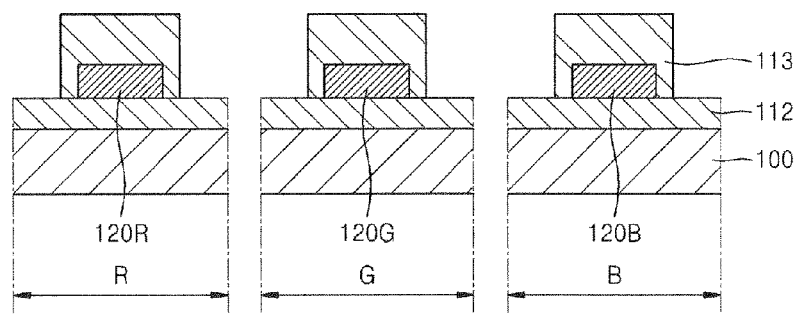

In reference to FIG. 8D, an overcoat layer 113 covering the red, green, and blue color filters 120R, 120G, and 120B is formed. The overcoat layer 113 may have a thickness in a range from about 1 μm to about 10 μm.

Figure 8E:
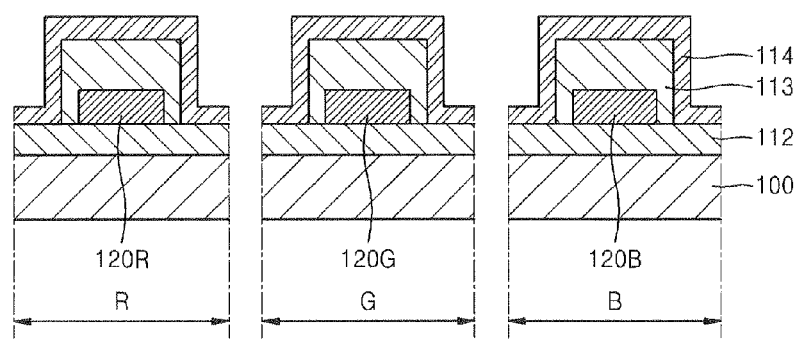

In reference to FIG. 8E, a second passivation layer 114 is formed to surround the overcoat layer 113 on the first passivation layer 112. In one embodiment, the second passivation layer 114 may be formed to cover the entirety of each overcoat layer 113 for each pixel. The second passivation layer 114 may be a $SiO_x$ group layer or a $SiN_x$ group layer. The second passivation layer 114 may have a thickness in a range from about 500 Å to about 10,000 Å. The black matrix 190 may be formed on the second passivation layer 114 by dividing optical transmission regions and optical blocking regions.

Figure 8F:
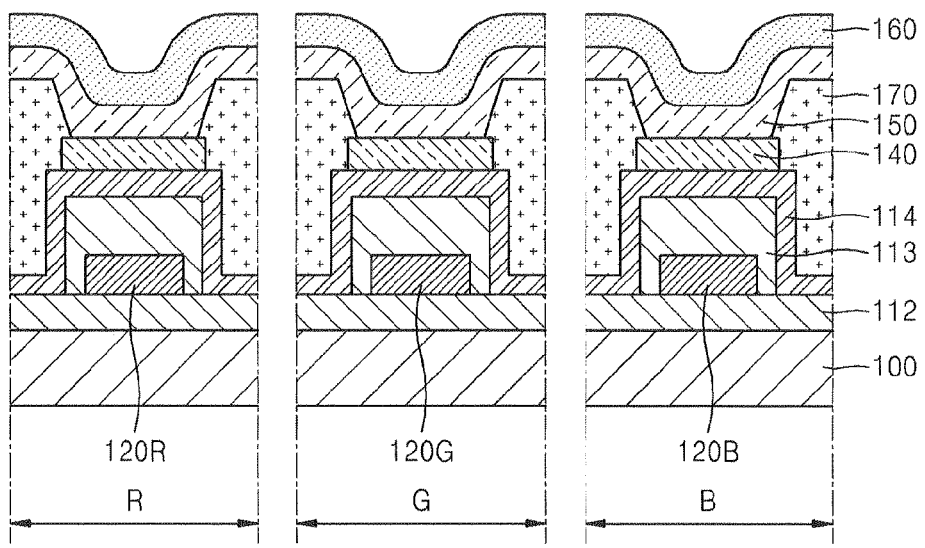

In reference to FIG. 8F, a pixel defining layer 170, a first electrode 140, an organic layer 150, and a second electrode 160 are formed on the second passivation layer 114. After the first electrode 140 is formed on the second passivation layer 114, the pixel defining layer 170 may be formed on the second passivation layer 114 by dividing a pixel region and a non-pixel region. Afterwards, the organic layer 150 is formed on the first electrode 140, and the second electrode 160 is formed on the organic layer 150. An operation of forming a polarizing film 180 (in reference to FIG. 5) on a surface of the substrate 100 may further be included.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus, comprising:
   a substrate;
   a first passivation layer formed on the substrate;
   at least one of color filters formed on the first passivation layer;
   an overcoat layer that covers the color filter;
   a second passivation layer that is formed on the first passivation layer and surrounds the overcoat layer;
   a first electrode formed on the second passivation layer;

a second electrode facing the first electrode; and
an organic layer disposed between the first electrode and the second electrode.

2. The organic light-emitting display apparatus of claim 1, wherein the color filter is one of red, green, and blue color filters.

3. The organic light-emitting display apparatus of claim 1, further comprising a polarizing film on a surface of the substrate.

4. The organic light-emitting display apparatus of claim 1, further comprising a black matrix in which optical transmission regions and optical blocking regions are divided on the second passivation layer.

5. The organic light-emitting display apparatus of claim 1, further comprising a black matrix in which optical transmission regions and optical blocking regions are divided between the substrate and the first passivation layer.

6. The organic light-emitting display apparatus of claim 1, further comprising a pixel defining layer in which a pixel region and a non-pixel region are divided on the second passivation layer.

7. The organic light-emitting display apparatus of claim 1, wherein the color filter has a thickness in a range from about 1 μm to about 5 μm.

8. The organic light-emitting display apparatus of claim 1, wherein the overcoat layer has a thickness in a range from about 1 μm to about 10 μm.

9. The organic light-emitting display apparatus of claim 1, wherein the first and second passivation layers comprise a $SiO_x$ group layer or a $SiN_x$ group layer.

10. The organic light-emitting display apparatus of claim 1, wherein the second passivation layer has a thickness in a range from about 500 Å to about 10,000 Å.

11. A method of manufacturing an organic light-emitting display apparatus, the method comprising steps of:
providing a substrate;
forming a first passivation layer on the substrate;
forming at least one color filter on the first passivation layer;
forming an overcoat layer that covers the color filter;
forming a second passivation layer on the first passivation layer to surround the overcoat layer;
forming a first electrode on the second passivation layer;
forming an organic layer on the first electrode; and
forming a second electrode on the organic layer.

12. The method of claim 11, wherein
the forming of the first passivation layer on the substrate comprises forming the first passivation layer by using a $SiO_x$ group layer or a $SiN_x$ group layer, and
the forming of the second passivation layer on the first passivation layer comprises forming the first passivation layer by using a $SiO_x$ group layer or a $SiN_x$ group layer.

13. The method of claim 11, wherein the forming of the second passivation layer comprises forming the second passivation layer to have a thickness in a range from about 500 Å to about 10,000 Å.

14. The method of claim 11, wherein the forming of at least one color filter on the first passivation layer comprises forming the color filter to have a thickness in a range from about 1 μm to about 5 μm.

15. The method of claim 11, wherein the forming of the overcoat layer comprises forming the overcoat layer to have a thickness in a range from about 1 μm to about 10 μm.

16. The method of claim 11, further comprising forming a pixel defining layer in which a pixel region and a non-pixel region are divided on the second passivation layer between the forming of the first electrode and the forming of the organic layer.

17. The method of claim 11, after the forming of the second electrode on the organic layer, further comprising additionally forming a polarizing film on a surface of the substrate.

18. The method of claim 11, further comprising forming a black matrix in which optical transmission regins and optical blocking regions are divided on the second passivation layer between the forming of the second passivation layer and the forming of the first electrode on the second passivation layer.

19. The method of claim 11, further comprising forming a black matrix in which optical transmission regins and optical blocking regions are divided on the substrate between the forming of the substrate and the forming of the first passivation layer on the substrate.

* * * * *